United States Patent [19]

Kokubun

[11] Patent Number: 4,952,821
[45] Date of Patent: Aug. 28, 1990

[54] VOLTAGE DETECTION CIRCUIT AND COMPARISON VOLTAGE GENERATOR THEREFOR

[75] Inventor: Hitoshi Kokubun, Tokyo, Japan

[73] Assignee: Oki Electric Industry Co., Ltd., Tokyo, Japan

[21] Appl. No.: 206,864

[22] Filed: Jun. 13, 1988

[30] Foreign Application Priority Data

Jun. 12, 1987 [JP] Japan ................. 62-145186

[51] Int. Cl.$^5$ .................... H03K 5/08; H03K 5/24
[52] U.S. Cl. ................... 307/350; 307/356; 307/362; 307/494
[58] Field of Search ........... 307/264, 362, 356, 490, 307/491, 494, 497, 350

[56] References Cited

U.S. PATENT DOCUMENTS 4,533,846  8/1985  Simko .
4,668,932  5/1987  Drori .
4,721,865  1/1988  Tallaron et al. ............... 307/350

FOREIGN PATENT DOCUMENTS 0117812  6/1985  Japan ................... 307/362

OTHER PUBLICATIONS

IEEE Journal of Solid-State Circuits, vol. SC-1-8, No. 5; Oct., 1983, "High-Voltage Regulation and Process Considerations for High-Density 5 V-Only E$^2$-PROM's"; Oto. et al.

Primary Examiner—John Zazworsky
Attorney, Agent, or Firm—Wenderoth, Lind & Ponack

[57] ABSTRACT

In a voltage detection circuit, a comparison voltage generator includes reference-setting capacitors, each having a first terminal connected to a comparison voltage node, and switching circuits provided in association with the respective reference-setting capacitors, each switching circuit selectively connecting a second terminal of the associated reference setting capacitor either to a first potential node or to a second potential node.

21 Claims, 5 Drawing Sheets

F I G. 4
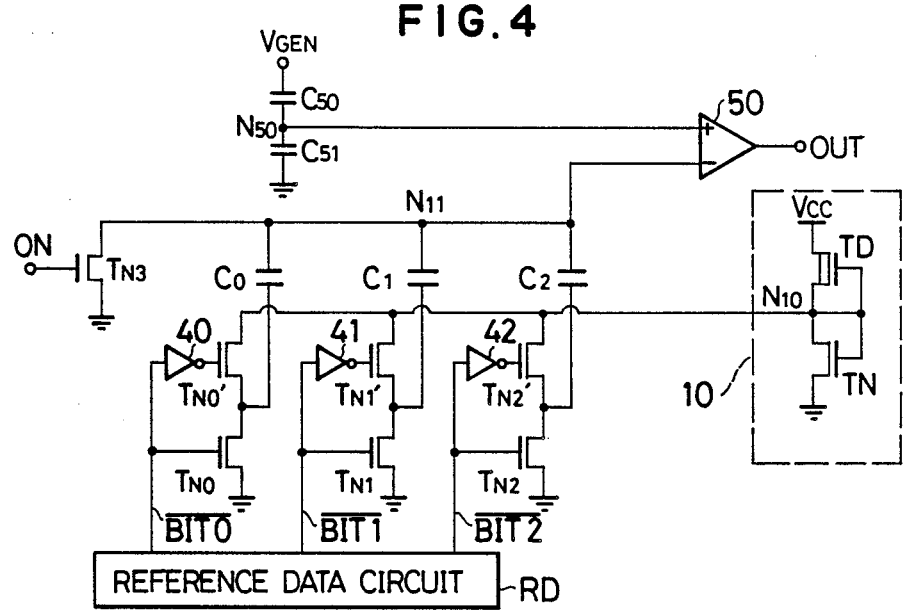

VOLTAGE DETECTION CIRCUIT AND COMPARISON VOLTAGE GENERATOR THEREFOR

BACKGROUND OF THE INVENTION

This invention relates to a voltage detection circuit and an adjustable comparison voltage generator which can be used in the voltage detection circuit.

Certain types of semiconductor integrated circuits need to internally generate (i.e., within the circuit) a signal voltage which is higher than a power supply voltage. Examples of such circuits are electrically erasable and programmable read-only memory chips that need high programming or writing voltages. Such circuits require a voltage detection circuit for producing an internal reference voltage and for comparing a detected voltage with the reference voltage. The voltage detection circuit also includes means for adjusting the reference voltage.

A prior art reference voltage generator is shown in FIG. 1, which is extracted from FIG. 10, of "high-Voltage Regulation and Process Considerations for high-Density 5 V-only E$^2$PROM's," *IEEE Journal of Solid-State Circuits*, Vol. SC-18, No. 5, October 1983, p. 536. The portion enclosed in the chain line is a reference voltage generator 1, which provides a reference voltage $V_{N1}$ at a node N1. The voltage to be compared with the reference voltage $V_{N1}$ is labeled $V_{GEN}$. The comparison is performed by a differential amplifier I1, the output OUT of which can be used to regulate $V_{GEN}$. The differential amplifier can be a device with two output states that detects when $V_{GEN}$ exceeds the reference voltage and furnishes an output signal OUT that is high when $V_{GEN}$ is greater than $V_{N1}$ and low when $V_{GEN}$ is less than $V_{N1}$. The output OUT is connected to a circuit, not shown in the drawing, that controls $V_{GEN}$, such as a circuit comprising a pumping circuit that raises $V_{GEN}$ while OUT is low and a switching circuit that suspends the pumping action when OUT becomes high.

The reference voltage generator 1 includes a differential amplifier circuit 2 comprising load resistors R3 and R4 connected to the supply voltage Vcc, an NMOS enhancement-type transistor T3, an NMOS depletion-type transistor T4, and a constant-current source I3. One terminal of the constant-current source I3 is connected to ground; the other terminal is connected via a node N5 to the source terminals of the transistors T3 and T4; the drain terminals of the transistors T3 and T4 are respectively connected through nodes N3 and N4 to the load resistors R3 and R4. The gate terminal of the transistor T3 is connected to a node N2. The gate terminal of the transistor T4 is grounded. The gate terminals of the transistors T3 and T4 act as the inputs of the differential amplifier circuit 2.

The differential amplifier circuit 2 serves as an input stage for another differential amplifier I2, the output of which is the reference voltage $V_{N1}$ provided at the node N1. The output of the differential amplifier I2 is also connected through a resistor string comprising resistors R0, R1, and R2 to the node N2, which is an input node of the differential amplifier circuit 2. Due to this circuit topology and to the threshold difference between the enhancement-type NMOS transistor T3 and the depletion-type NMOS transistor T4, the differential amplifier circuit 2 and the differential amplifier I2 form a negative feedback loop which holds the reference voltage $V_{N1}$ at a constant level which may exceed the level of the supply voltage.

The resistors R0, R1, and R2, which are connected in series between the output node N1 and the internal node N2, provide a means of adjusting the reference voltage. The resistance values of the resistors R0, R1, and R2 are in the ratio 1:2:4. NMOS enhancement-type transistors T0, T1, and T2 are connected in parallel with the resistors R0, R1, and R2 respectively. The gate terminals of the transistors T0, T1, and T2 are connected to input signal lines $\overline{BIT0}$, $\overline{BIT1}$, and $\overline{BIT2}$. High and low logic levels applied to the input signal lines $\overline{BIT0}$, $\overline{BIT1}$, and $\overline{BIT2}$ switch the transistors T0, T1, and T2 on and off. The logic levels on the lines $\overline{BIT0}$ to $\overline{BIT2}$ represent binary-coded data representing the value of the reference voltage.

If the on-state resistances of the transistors T0, T1, and T2 are negligibly small in comparison to the resistances of the resistors R0, R1, and R2, then the total resistance R between the nodes N1 and N2 is the sum of the resistances of those resistors R0, R1, and R2 for which the corresponding transistor T0, T1, or T2 is turned off.

The node N2, in addition to being connected to the gate of the transistor T3, is grounded through a constant-current source I4. Let $V_{N2}$ be the voltage at node N2. Then, $$V_{N1} = V_{N2} + R \cdot I4$$

Since the differential amplifier circuit 2 and differential amplifier I2 operate in a linear fashion, the reference voltage $V_{N1}$ should in theory be a linear function of the digital value applied to $\overline{BIT0}$, $\overline{BIT1}$, and $\overline{BIT2}$. Hence $V_{GEN}$ should be a linear function of this digital input value.

As FIG. 2 shows, however, $V_{GEN}$ is not in fact a linear function of the digital input applied to $\overline{BIT0}$, $\overline{BIT1}$, and $\overline{BIT2}$. The data in FIG. 2 were derived by simulating the operation of the circuit in FIG. 1 on a computer and finding the value of $V_{GEN}$ that causes the output OUT of the differential amplifier I1 to invert.

When the output voltage of the voltage detection circuit is used as a control signal for a high voltage generator, the generated voltage $V_{GEN}$ is dependent on the power supply voltage $V_{CC}$ for the internal circuit. The generated voltage may be used for writing in an EEPROM. In such a case, when the power supply voltage $V_{CC}$ is lowered, the writing voltage $V_{GEN}$ is also lowered. This may cause a failure of the writing.

Moreover, the linearity of the generated voltage $V_{GEN}$ with respect to the reference voltage setting data of the prior art circuit is poor, so that it was difficult to minutely adjust the generated voltage $V_{GEN}$.

Furthermore, it is necessary to increase the number of bits of the reference voltage setting data to achieve minute adjustment of the generated voltage. However, the resistances of the resistors R0, R1 and R2 must be larger than the on-state resistances of the transistors T0, T1 and T2. It was therefore difficult to increase the number of the bits of the reference voltage setting data.

SUMMARY OF THE INVENTION

This invention is directed toward solutions to the above problems of nonlinearity, supply-voltage dependence, and fineness of control.

According to one aspect of the invention, there is provided a voltage detection circuit comprising:

a detected-voltage node at which a voltage to be detected is applied;

a comparison voltage node;

a plurality of reference setting means each comprising:

a reference setting capacitor having a first terminal connected to said comparison voltage node and having a second terminal; and a switching circuit for selectively connecting said second terminal of said reference setting capacitor to one of either a first potential node and a second potential node;

a first voltage detecting capacitor having a first terminal connected to the comparison voltage node and a second terminal connected to the detected voltage node, and a second voltage detecting capacitor having a first terminal connected to the comparison node and a second terminal connected to a third potential node; and a voltage comparison circuit for comparing a voltage on the comparison voltage node with a voltage on a fourth potential node to produce an output signal indicating the result of the comparison.

According to another aspect of the invention, there is provided a comparison voltage generator comprising:

a comparison voltage node;

a plurality of reference setting means each having:

a reference setting capacitor having a first terminal connected to said comparison voltage node and having a second terminal, and a switching circuit for selectively connecting said second terminal of said reference setting capacitor to one of either a first potential node and a second potential node;

a voltage detecting means for detecting a voltage to be detected and producing a voltage signal indicative of the voltage to be detected; and a voltage comparison circuit comparing the voltage signal from said voltage detecting means with a voltage on said comparison voltage node.

BRIEF DESCRIPTION OF THE DRAWINGS

In the accompanying drawings:

FIG. 4 is a schematic diagram of a second embodiment of a voltage detection circuit in accordance with the present invention.

DETAILED DESCRIPTION OF THE PREFERRED EMBODIMENTS

The preferred embodiments of the present invention are described below with reference to the drawings.

Figure 1:
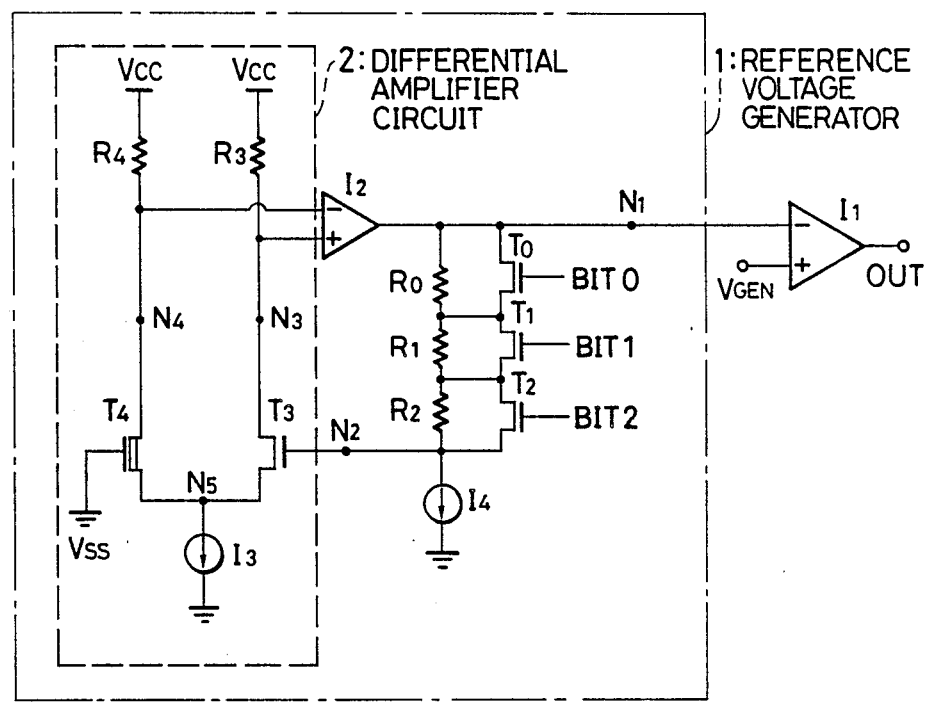
FIG. 1 is a schematic diagram of a prior art voltage detection circuit including a reference voltage generator.
Figure 2:
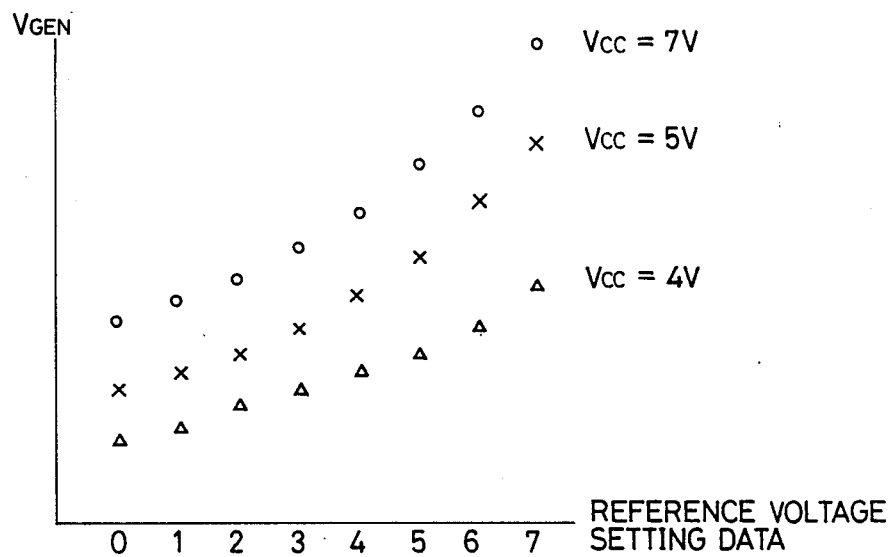
FIG. 2 is a plot of a computer simulation of the performance of the circuit in FIG. 1.
Figure 3:
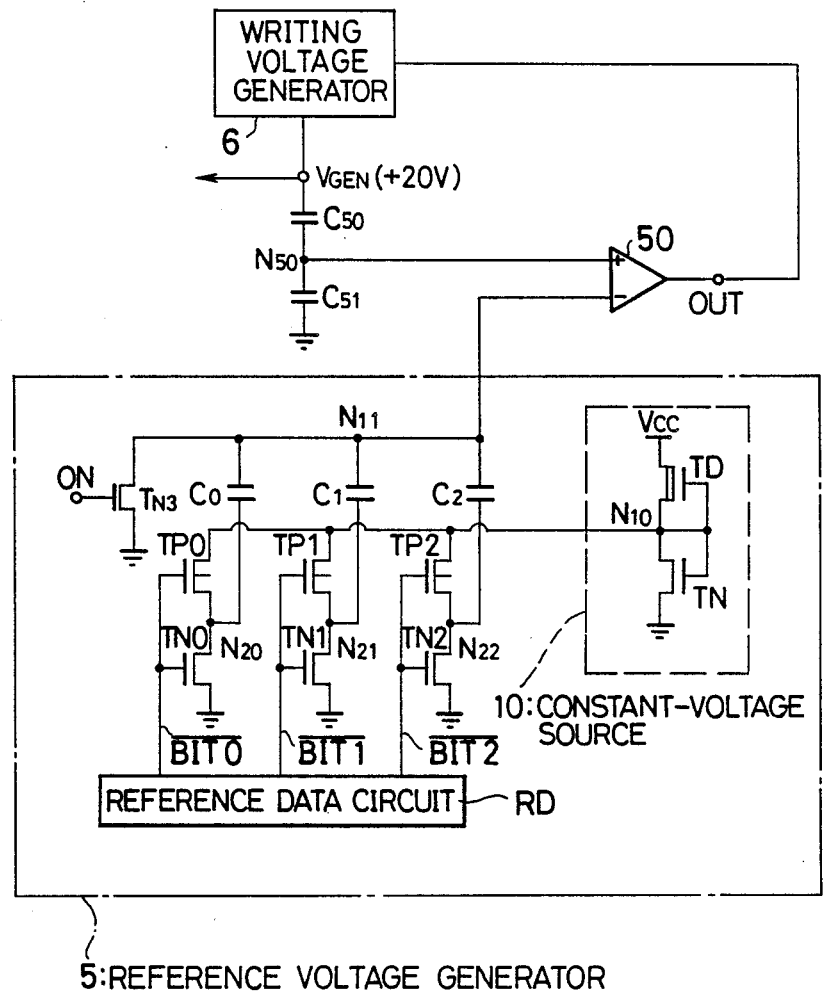
FIG. 3 is a schematic diagram of a first embodiment of a voltage detection circuit in accordance with the present invention.

FIG. 3 is a schematic diagram of a first embodiment of a voltage detection circuit in accordance with the present invention.

The part enclosed in the dashed line is a well-known constant-voltage source 10 comprising an NMOS enhancement-type transistor TN and an NMOS depletion-type transistor TD. The drain of the transistor TD is connected to the power supply voltage $V_{CC}$. The source of the transistor TN is connected to the ground. The source and the gate of the transistor TD and the drain and the gate of the transistor TN are connected together. This constant-voltage source 10 produces a constant voltage at a node N10 even if the power supply voltage $V_{CC}$ (+5 V) fluctuates.

The part enclosed in the chain line is a comparison voltage generator 5 which in this embodiment is a reference voltage generator comprising a capacitive voltage divider. More specifically, the node N10 is connected to the source terminals of PMOS enhancement-type transistors TP0, TP1, and TP2. The drain terminals of the transistors TP0, TP1, and TP2 are connected at nodes N20, N21, and N22 to the drain terminals of NMOS enhancement-type transistors TN0, TN1, and TN2. The source terminals of the transistors TN0, TN1, and TN2 are grounded. The gate terminals of the transistors TP0 and TN0 are connected in common to the signal line $\overline{BIT0}$; the gate terminals of the transistors TP1 and TN1 are connected in common to the signal line $\overline{BIT1}$; and the gate terminals of the transistors TP2 and TN2 are connected in common to the signal line $\overline{BIT2}$. These signal lines $\overline{BIT0}$ to $\overline{BIT2}$ are supplied from a reference data circuit RD and are bits of a binary-coded reference setting signal representing the reference voltage. The nodes N20, N21 and N22 are coupled through capacitors C0, C1, and C2, respectively, to a node N11. The capacitance ratios of the capacitors are C0:C1:C2 = 1:2:4.

The illustrated circuit further comprises an NMOS enhancement-type transistor TN3, the drain of which is connected to the node N11 and the source of which is connected to ground and the gate of which is connected to an input terminal for a signal denoted $\overline{ON}$. The signal $\overline{ON}$ is low when the reference voltage generator is operating, and high when it is not operating. When the reference voltage generator is not operating, the node N11 is tied through the transistor TN3 to ground level. When the reference voltage generator is operating, the node N11 is disconnected from ground and held at the desired reference voltage level $V_{N11}$.

The above-described reference voltage generator operates as follows. The node N10 is the output of the constant-voltage source 10, so it maintains a constant voltage $V_{N10}$. If $\overline{BIT0}$ is high, then the transistor TP0 is off and the transistor TN0 is on, so the node N20 is connected to ground. If $\overline{BIT0}$ is low, then the transistor TP0 is on and the transistor TN0 is off, so the node N20 is connected to the node N10 and has the same voltage level $V_{N10}$. The nodes N21 and N22 are controlled in a similar way by the inputs at $\overline{BIT1}$ and $\overline{BIT2}$, respectively. The inputs at $\overline{BIT0}$, $\overline{BIT1}$, and $\overline{BIT2}$ thus serve to place each of the nodes N20, N21, and N22 at either the ground level or the $V_{N10}$ level. The voltage level at the node N11 can be switched among eight levels according to the inputs at $\overline{BIT0}$, $\overline{BIT1}$, and $\overline{BIT2}$. The voltage $V_{N11}$ at the node N11 can then be expressed as follows:

$$V_{N11} = V_{N10}(\alpha_0 C0 + \alpha_1 C1 + \alpha_2 C2)/(C0 + C1 + C2)$$

Here $\alpha_0$, $\alpha_1$, and $\alpha_2$ are dimensionless binary variables. When, $\overline{BIT0}$ is high or low, the corresponding variable $\alpha_0$ is 0 or 1, respectively. Similarly, when $\overline{BIT1}$ is high or low, the corresponding variable $\alpha_1$ is 0 or 1. Similarly, when $\overline{BIT2}$ is high or low, the corresponding variable $\alpha_2$ is 0 or 1. Since C1=2 C0 and C2=4.C0, this reduces to:

$$V_{N11} = V_{N10}(\alpha_{N10} + 2\alpha_1 + 4\alpha_2)/7$$

The above equation shows that the voltage $V_{N11}$ at the node N11 does not follow the voltage variation of the power supply voltage $V_{CC}$. Hence the the reference voltage $V_{N11}$ is a linear function of the binary digital value applied to BIT0, BIT1, and BIT2.

The node N11 is connected to the negative input (−) of a differential amplifier 50. The positive input (+) is connected to a node N50, which is coupled through a capacitor C50 to a generated voltage $V_{GEN}$ to be controlled, which may be a written voltage of about 20 V used for writing data in an EEPROM. The node N50 is also coupled through another capacitor C51 to ground. The capacitors C50 and C51 form a capacitive voltage divider, the capacitive voltage divider produces a divided (detected) voltage near the reference voltage $V_{N11}$, so the $V_{N50}$ voltage at the node N50 is a fixed fraction of $V_{GEN}$:

$$V_{N50} = V_{GEN} \cdot C50/(C50 + C51)$$

The differential amplifier 50 compares a detected voltage $V_{N50}$ with the reference voltage $V_{N11}$. That is, the amplifier 50 detects a detected voltage $V_{N50}$ exceeding the reference voltage. The amplifier 50 thereby generates an output signal OUT which is used to control a writing voltage generator 6, which may comprise a pumping circuit to produce the writing voltage $V_{GEN}$.

FIG. 4 is a schematic diagram illustrating a second embodiment of this invention. Circuit elements that are identical to elements of the first embodiment are indicated with the same reference numerals, and detailed descriptions of them are omitted.

The difference between this embodiment and the first embodiment is that this embodiment uses NMOS transistors TN0′, TN1′, and TN2′ in place of the PMOS transistors TP0, TP1, and TP2. The gates of the transistors TN0′, TN1′, and TN2′ are connected to inverters 40, 41, and 42 which invert the signals $\overline{BIT0}$, $\overline{BIT1}$, and $\overline{BIT2}$. The result is that this embodiment operates in the same way as the first embodiment. An advantage of this embodiment over the first embodiment is that a high input at $\overline{BIT0}$, $\overline{BIT1}$, or $\overline{BIT2}$ is assured of turning off the transistor TN0′, TN1′, or TN2′, when the potential difference across the transistor TN0′, TN1′ or TN2′ is small, close to the threshold level of the transistor.

Figure 5:
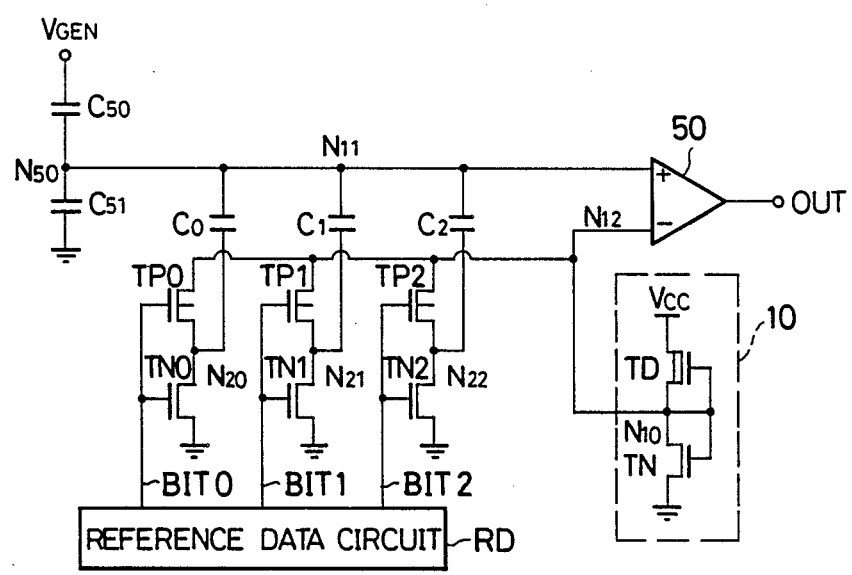
FIG. 5 is a schematic diagram of a third embodiment of a voltage detection circuit in accordance with the present invention.

FIG. 5 shows a third embodiment of a voltage detection circuit according to the present invention. In this circuit the node N50 is connected to the node N11, which is connected to the positive input (+) of the differential amplifier 50. The negative input (−) of the differential amplifier 50 is connected via a node N12 to the constant-voltage source 10. The node N12 is also connected to the drain terminals of the transistors TP0 to TP2.

Applied to the gate terminals of the transistors TP0 to TP2 and TN0 to TN2 are BIT0 to BIT2 rather than the inverted $\overline{BIT0}$ to $\overline{BIT2}$. In the circuit configuration in FIG. 5, the constant voltage $V_{N12}$ at the node N12 is applied to the voltage comparison circuit as the reference voltage. The voltage compared with $V_{N12}$ is determined from $V_{GEN}$ and $V_{N12}$ as well as BIT0 to BIT2 by a capacitive voltage divider involving the capacitors C50, C51, C0, C1, and C2. The inputs at BIT0, BIT1, and BIT2 adjust the voltage division ratio by switching the voltages provided to the capacitors C0, C1, and C2 between $V_{N12}$ and ground. The switching circuit comprising the transistors TP0 to TP2 and TN0 to TN2 is identical to that shown in FIG. 3.

An advantage of adjusting the division ratio applied to $V_{GEN}$ to produce a reference voltage and comparing it with a constant voltage is that the differential amplifier 50 always operates at the same gain, regardless of the inputs at BIT0, BIT1, and BIT2, i.e., the value of the binary-coded reference-setting signal.

Figure 6:
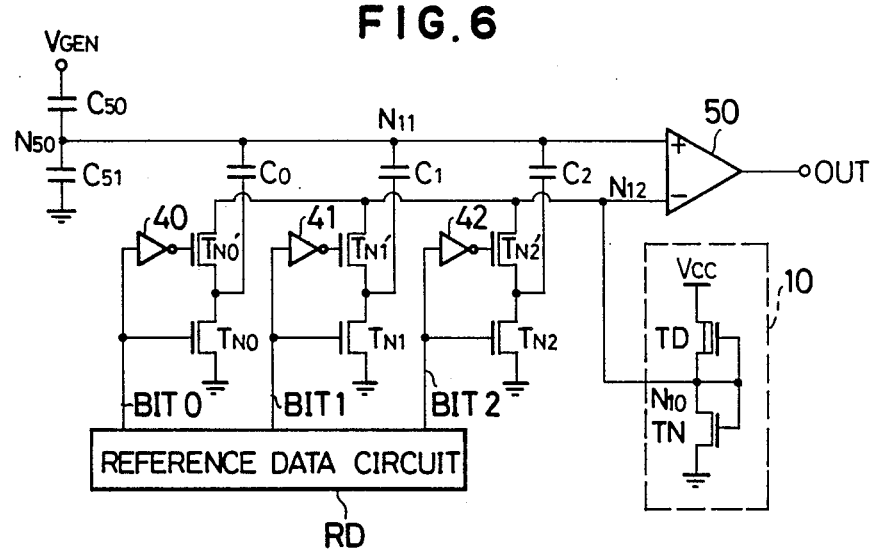
FIG. 6 is a schematic diagram of a fourth embodiment of a voltage detection circuit in accordance with the present invention.

FIG. 6 shows a fourth embodiment of a voltage detection circuit according to the present invention. This embodiment is generally identical to the embodiment of FIG. 5. But the switching circuit is identical to that of FIG. 4, rather than that of FIG. 3 which is incorporated in the embodiment of FIG. 5. This embodiment therefore has the additional advange of the embodiment of FIG. 4.

Figure 7:
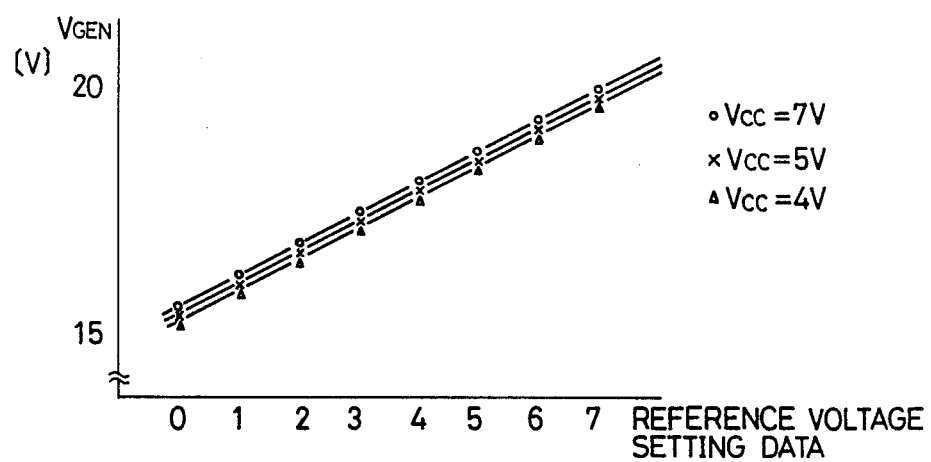
FIG. 7 is a plot of a computer simulation of the performance of the circuit in FIG. 6.

FIG. 7 shows the results of computer simulation of the operation of the circuit in FIG. 6, in which the value of $V_{GEN}$ is plotted as a function of the reference voltage represented by the binary-coded reference-setting data at BIT0, BIT1, and BIT2. It can be seen that the behavior of this circuit is highly linear, and substantially independent of the supply voltage.

Figure 8:
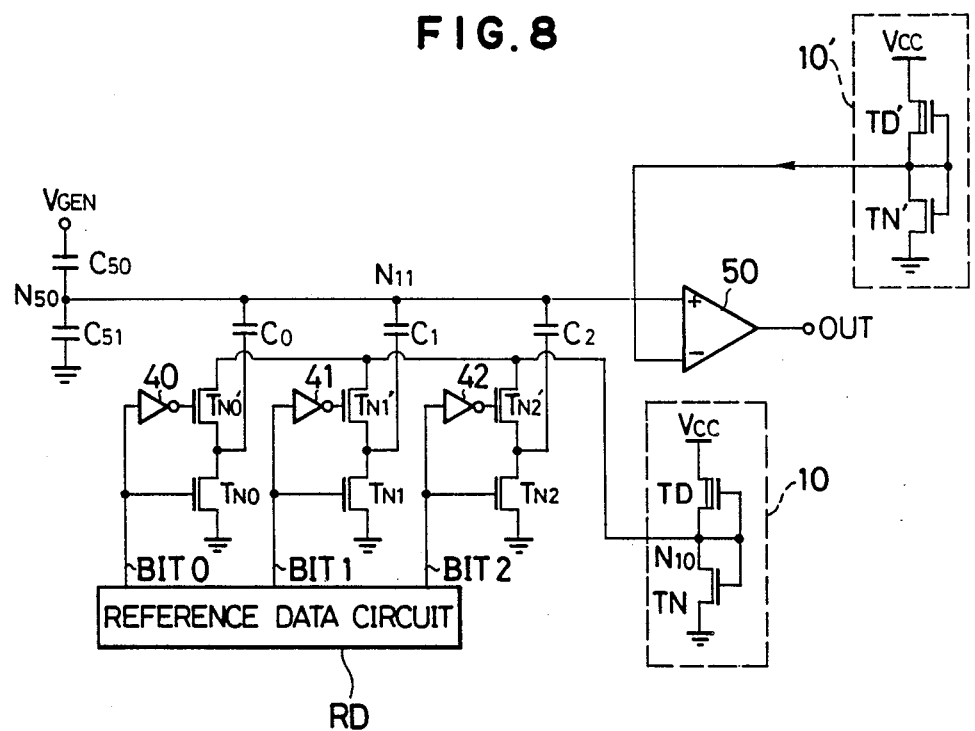
FIG. 8 is a schematic diagram of a modification of the fourth embodiment.

FIG. 8 shows a modification of the embodiment of FIG. 6. In this embodiment, the negative input (−) of the differential amplifier 50 is connected to a separate constant voltage source 10′ similar to the constant voltage source 10. It is also possible to use a voltage source with an adjustable voltage in place of the constant voltage source 10′.

The modification shown in FIG. 8 can also be applied to the embodiment of FIG. 5.

A voltage detection circuit and the reference voltage circuit according to the invention permit fine adjustment with good linearity, and the circuit operation can be made substantially independent of the supply voltage.

An additional advantage of this invention is that it permits more input signal lines to be added without restrictions imposed by the on-state resistances of the transistors controlled by the signal lines. Thus finer adjustment can be achieved by adding further bits of the reference setting data.

What is claimed is:

1. A voltage detection circuit comprising:
   a detected-voltage node at which a voltage to be detected is applied;
   a comparison voltage node;
   a plurality of reference setting means each comprising:
   a reference setting capacitor having a first terminal connected to said comparison voltage node and having a second terminal; and a switching circuit for selectively connecting said second terminal of said reference setting capacitor to one of either a first potential node and a second potential node;

third and fourth potential nodes;

a first voltage detecting capacitor having a first terminal connected to said comparison voltage node and a second terminal connected to said detected voltage node, and a second voltage detecting capacitor having a first terminal connected to said comparison voltage node and a second terminal connected to said third potential node; and a voltage comparison circuit for comparing a voltage on said comparison voltage node with a voltage on said fourth potential node to produce an output signal indicating the result of said comparison.

2. A circuit according to claim 1, wherein said second potential node and said third potential node are arranged so as to have the same potential.

3. A circuit according to claim 2, wherein said second potential node and said third potential node are arranged so as to have a fixed potential.

4. A circuit according to claim 1, wherein said first potential node and said fourth potential node are arranged so as to have the same potential.

5. A circuit according to claim 4, further comprising a constant voltage source for producing a constant voltage, wherein said first potential node and said fourth potential node are connected to said constant voltage source.

6. A circuit according to claim 1, wherein said switching circuit of each of said reference setting means comprises a first switching element connecting, when conductive, said second terminal of said reference-setting capacitor to said first potential node and a second switching element connecting, when conductive, said second terminal of said reference-setting capacitor to said second potential node; and wherein said first and second switching elements are arranged such that when one of them is conductive the other is not conductive.

7. A circuit according to claim 6, wherein said second switching element comprises an NMOS FET having a gate and receiving at its gate a two-state signal, and wherein said first switching element comprises an NMOS FET having a gate and receiving said two-state signal through an inverter.

8. A circuit according to claim 6, wherein said second switching element comprises an NMOS FET having a gate and receiving at its gate a two-state signal, and said first switching element comprises a PMOS FET having a gate and receive at its gate said two-state signal.

9. A circuit according to claim 1, wherein said switching of said reference setting means are controlled by respective bits of a binary-coded reference setting signal, and the capacitance values of said reference-setting capacitors are in the ratio of consecutive integer powers of two.

10. A circuit according to claim 1, further comprising a reference-setting circuit which provides a binary-coded reference-setting signal indicating a value of a reference voltage, wherein said switching circuits of said reference setting means are controlled in accordance with the respective bits of said binary-coded reference-setting signal.

11. A circuit according to claim 1, wherein said voltage comparison circuit comprises a differential amplifier.

12. A voltage detection circuit comprising:
a comparison voltage node;
a plurality of reference setting means each having:

a reference setting capacitor having a first terminal connected to said comparison voltage node and having a second terminal, and a switching circuit for selectively connecting said second terminal of said reference setting capacitor to one of either a first potential node and a second potential node;

a voltage-detecting means for detecting a voltage to be detected and for producing a voltage signal indicative of the voltage to be detected; and a voltage comparison circuit for comparing the voltage signal from said voltage-detecting means with a voltage on said comparison voltage node.

13. A circuit according to claim 12, wherein said second potential node is arranged so as to have a fixed potential.

14. A circuit according to claim 12, further comprising a constant voltage source for producing a constant voltage, wherein said first potential node is connected to said constant voltage source.

15. A circuit according to claim 12, wherein said switching circuit of each of said reference setting means comprises a first switching element for connecting, when conductive, said second terminal of said reference-setting capacitor to said first potential node and a second switching element for connecting, when conductive, said second terminal of said reference-setting capacitor to said second potential node; and said first and second switching elements arranged such that when one of them is conductive the other is not conductive.

16. A circuit according to claim 15, wherein said second switching element comprises an NMOS FET having a gate and receiving at its gate a two-state signal, and said first switching element comprises an NMOS FET having a gate and receiving said two-state signal through an inverter.

17. A circuit according to claim 15, wherein said second switching element comprises an NMOS FET having a gate and receiving at its gate a two-state signal, and said first switching element comprises a PMOS FET having a gate receiving at its gate said two-state signal.

18. A circuit according to claim 12, wherein said switching circuits of said reference setting means are controlled by respective bits of a binary-coded reference setting signal, and the capacitance values of reference-setting capacitors of said reference setting means are in the ratio of consecutive integer powers of two.

19. A circuit according to claim 12, further comprising a reference-setting circuit which provides a binary-coded reference-setting signal indicating the value of the reference voltage, wherein said switching circuits of said reference setting means are controlled in accordance with the respective bits of said binary-coded reference-setting signal.

20. A reference voltage generator according to claim 12, further comprising an additional switching means connected between said comparison node and a fixed potential node.

21. A reference voltage generator according to claim 20, wherein said additional switching means comprises an NMOS transistor having a drain which is connected to said comparison node, and having a source which is connected to a ground, and having a gate which is connected to an input signal line for applying a signal that is high when said reference voltage generator is operating, and low when said reference voltage generator is not operating.

* * * * *